United States Patent
Chen et al.

(10) Patent No.: US 7,525,147 B2
(45) Date of Patent: Apr. 28, 2009

(54) MEMORY STRUCTURE

(75) Inventors: Tu Pei Chen, Singapore (SG); Chi Yung Ng, Singapore (SG)

(73) Assignee: Nanyang Technological University, Singapore (SG)

( * ) Notice: Subject to any disclaimer, the term of this patent is extended or adjusted under 35 U.S.C. 154(b) by 33 days.

(21) Appl. No.: 11/594,143

(22) Filed: Nov. 8, 2006

(65) Prior Publication Data

US 2007/0105310 A1 May 10, 2007

Related U.S. Application Data

(60) Provisional application No. 60/735,137, filed on Nov. 9, 2005.

(51) Int. Cl.
   *H01L 29/76* (2006.01)
(52) U.S. Cl. .................. 257/314; 257/315; 257/325; 257/E21.209; 257/E21.2; 257/E29.304; 438/257
(58) Field of Classification Search ............. 257/314, 257/315, 316, 325, E21.209, E29.304, E21.2, 257/E29.162; 438/257, 260
See application file for complete search history.

(56) References Cited

U.S. PATENT DOCUMENTS

| | | | | |
|---|---|---|---|---|
| 3,387,286 | A | | 6/1968 | Dennard |
| 5,731,598 | A | * | 3/1998 | Kado et al. ............ 257/30 |
| 6,407,424 | B2 | * | 6/2002 | Forbes ................. 257/315 |
| 6,774,061 | B2 | * | 8/2004 | Coffa et al. ............ 438/197 |
| 6,861,707 | B1 | * | 3/2005 | King ................... 257/345 |
| 2006/0154432 | A1 | * | 7/2006 | Arai et al. ............ 438/385 |
| 2006/0231889 | A1 | * | 10/2006 | Chen et al. ............ 257/325 |
| 2007/0105312 | A1 | * | 5/2007 | Min .................... 438/257 |

OTHER PUBLICATIONS

Fujio Masuoka et al., "New Ultra High Density EPROM and Flash EEPROM with NAND Structure Cell", IEEE IEDM Technical Digest 1987, pp. 552-555.
International Technology Roadmap for Semiconductors 2004 Update, http://public.itrs.net/.
J. A. Mandelman et al., "Challenges and future directions for the scaling of dynamic random-access memory (DRAM)", IBM J. Res & Dev., vol. 46, No. 2/3, Mar./May 2002, pp. 187-212.
Luan C. Tran, "Beyond Nanoscale DRAM and Flash—Challenges and Opportunities for Research in Emerging Memory Devices", IEEE 2004, ISBN: 0-7803-8369-9/04, pp. 35-38.
Pierre C. Fazan et al., "A Simple 1-Transistor Capacitor-Less Memory Cell for High Performance Embedded DRAMs", IEEE 2002 Custom Integrated Circuits Conference, pp. 99-102.
S. Lombardo et al., "Silicon nanocrystal memories", Microelectronic Engineering 72 (2004), Elsevier B.V., pp. 388-394.
Sandip Tiwari et al., "A silicon nanocrystals based memory", American Institute of Physics, Appl. Phys. Lett. 68 (10), Mar. 4, 1996, pp. 1377-1379.

* cited by examiner

*Primary Examiner*—Sue Purvis
*Assistant Examiner*—Fazli Erdem
(74) *Attorney, Agent, or Firm*—Davidson Berquist Jackson & Gowdey LLP (57) ABSTRACT

A memory structure including a semiconductor substrate, an insulator layer formed on the semiconductor substrate and a gate layer formed on the insulator layer is disclosed. The insulator layer includes a first nanocrystal implanted region proximate to the gate layer and a second nanocrystal implanted region proximate to the semiconductor substrate, wherein the first nanocrystal implanted region has an average nanocrystal concentration which is higher than an average nanocrystal concentration of the second nanocrystal implanted region.

21 Claims, 6 Drawing Sheets

MEMORY STRUCTURE

CROSS-REFERENCE TO RELATED APPLICATION

This application claims the benefit of priority of U.S. provisional application No. 60/735,137 filed Nov. 9, 2005, the contents of each being hereby incorporated by reference it its entirety for all purposes.

FIELD OF THE INVENTION

The present invention relates to the field of volatile memory devices, and in particular, to a nanocrystal-based one-transistor dynamic random access memory (DRAM) with fast programming speed and long retention time.

BACKGROUND OF THE INVENTION

Since the invention of one-transistor-one-capacitor (ITIC) DRAM cell in the late 1960s as described in U.S. Pat. No. 3,387,286, the technology has been advancing continuously and is now approaching the sub-100 nm generation. To go beyond the sub-100 nm generation, there are many challenges and scaling issues as described in publication "Challenges and future directions for the scaling of dynamic random-access memory (DRAM)", J. A. Mandelman et. al., IBM J. Res. & Dev. Vol 46 No. 2/3 March/May 2002. Some of these challenges and scaling issues include process and capacitance challenges and voltage-scaling and leakage issues.

Publication "International Technology Roadmap for Semiconductor 2004 Update" sets out projected key parameters of different emerging research memory devices with present day memory technologies as benchmarks. In particular, for present day memory technology such as the ITIC DRAM, the programming time has been indicated to be less than 15 ns and the retention time to be approximately 64 ms.

Several new memory structures have been proposed for DRAM applications. A memory structure that utilizes direct tunneling into silicon nanocrystal (nc-Si) for producing bistability in the conduction of a transistor channel and exhibiting quasi-non-volatile characteristics has been proposed in publication "A silicon nanocrystals based memory", Sandip Tiwari et. al., Appl. Phys. Lett. 68 (10), 4 March 1996. The memory structure comprises a thin tunneling oxide of approximately 1.1 to 1.8 nm in thickness which separates the inversion surface of an n-channel silicon field-effect transistor (FET) from a distributed film of nc-Si that covers the entire surface channel region. The memory structure further comprises a thicker tunneling oxide of approximately 4.5 nm or higher which separates the nc-Si from the control gate of the FET. An injection of an electron from the inversion layer into the nc-Si occurs via direct tunneling when the control gate is forward biased with respect to the source and drain. The resulting stored charge screens the gate charge and reduces the conduction in the inversion layer, i.e., it effectively shifts the threshold voltage of the device to be more positive. However, the programming time of the memory structure is approximately 100 ns which is too slow for DRAM applications.

Recently, a new memory structure which has a relatively short programming time of about 3 ns was proposed in publication "A simple 1-transistor capacitor-less memory cell for high performance embedded DRAMs", Pierre C. Fazan et. al., IEEE 2002 Custom Integrated Circuits Conference". However such a memory structure is based on silicon on insulator (SOI) technology which is expensive, and the retention time is less than 10 s.

Therefore, there is still a need for an alternative DRAM structure that has good reliability characteristics, a fast programming time and a long retention time, which could tremendously reduce the power dissipation required for data refreshment.

SUMMARY OF THE INVENTION

In one embodiment of the invention, a memory structure is provided including a semiconductor substrate, an insulator layer formed on the semiconductor substrate and a gate layer formed on the insulator layer. The insulator layer further includes a first nanocrystal implanted region proximate to the gate layer and a second nanocrystal implanted region proximate to the semiconductor substrate, wherein the first nanocrystal implanted region has an average nanocrystal concentration which is higher than an average nanocrystal concentration of the second nanocrystal implanted region.

The following figures illustrate various exemplary embodiments of the present invention. However, it should be noted that the present invention is not limited to the exemplary embodiments illustrated in the following figures.

DETAILED DESCRIPTION OF THE INVENTION

Exemplary embodiments of a volatile memory device are described in details below with reference to the accompanying figures. In addition, the exemplary embodiments described below can be modified in various aspects without changing the essence of the invention. It has been found that embodiments of such a volatile memory device have fast programming speed and long retention time.

Figure 1A:
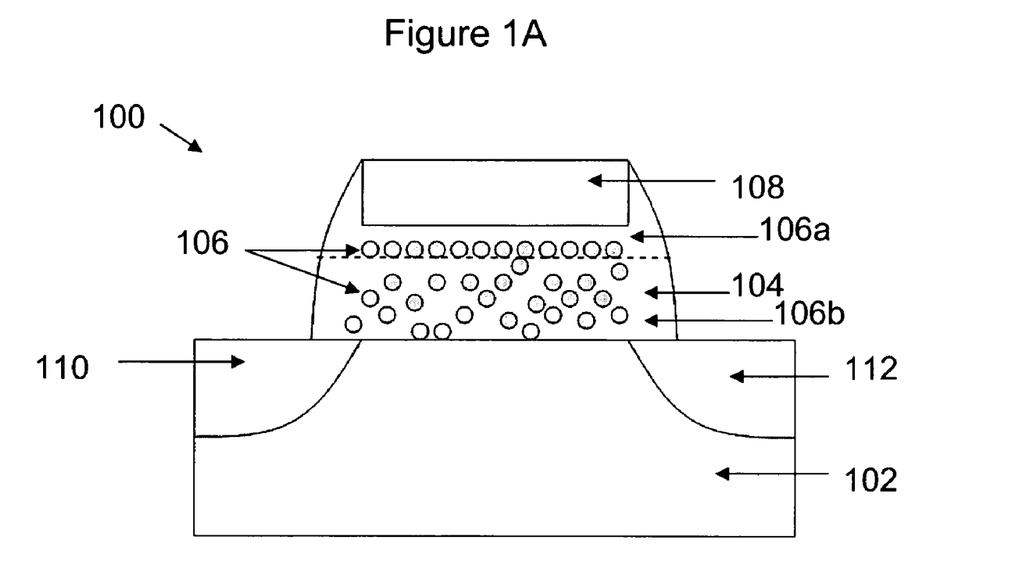
FIG. 1A shows a schematic cross-sectional view of a 1-transistor DRAM structure according to an embodiment of the present invention and FIG. 1B shows a profile of implanted silicon ion concentration versus depth obtained from Stopping and Range of Ions in Matter (SRIM) simulation according to an embodiment of the present invention.

FIG. 1A shows a schematic cross-sectional view of a 1-transistor (IT) DRAM structure according to an embodiment of the present invention. The IT-DRAM 100 structure comprises a semiconductor substrate 102, a gate oxide 104 formed on the semiconductor substrate 102, a plurality of nanocrystals 106 distributed throughout the gate oxide 104, for example a varying implanted region 106a and a uniform implanted region 106b, and a polysilicon gate 108 deposited over the gate oxide 104. The semiconductor substrate 102 may be silicon (Si), germanium (Ge), silicon germanium (SiGe) and silicon-on-insulator (SOI) but not so limited. The gate oxide 104 may be an insulating layer for example silicon oxide ($SiO_2$), silicon nitride ($Si_3N_4$), silicon oxynitride ($SiO_xN_y$) but not so limited. The gate oxide 104 may also be a high-k dielectric material for example hafnium oxide ($HfO_2$), hafnium aluminate ($HfAlO_2$), yttrium oxide ($Y_2O_3$) but not so limited. In the present invention, the term "high-k dielectric material" refers to a dielectric material having a dielectric constant k being clearly higher than approximately 3.9. In some embodiments of the invention, the high-k dielectric material has a dielectric constant k higher than about 5, about 6, about 8 or about 12. The nanocrystals 106 may be silicon, germanium, silicon germanium, silicon carbide, gallium arsenide, indium arsenide but not so limited. The nanocrystals 106 may also be metals or metal alloys for example, aluminum, gold, silver, cobalt, tin, iron, copper, nickel, palladium, platinum, rhodium, tungsten and combinations thereof but not so limited. The average size or diameter of the nanocrystals 106 could be between about 1 nm to about 10 nm, typically about 4 nm.

The IT-DRAM 100 further comprises a source region 110 and a drain region 112 formed in the semiconductor substrate 102 on each respective side of the gate oxide 104. For an n-channel metal oxide semiconductor (NMOS), the semiconductor substrate 102 is of p-type conductivity, the polysilicon gate 108, the source 110 and drain 112 regions are of n-type conductivity. For a p-channel metal oxide semiconductor (PMOS), the semiconductor substrate 102 is of n-type conductivity, the polysilicon gate 108, the source 110 and drain 112 regions are of p-type conductivity.

Figure 1B:
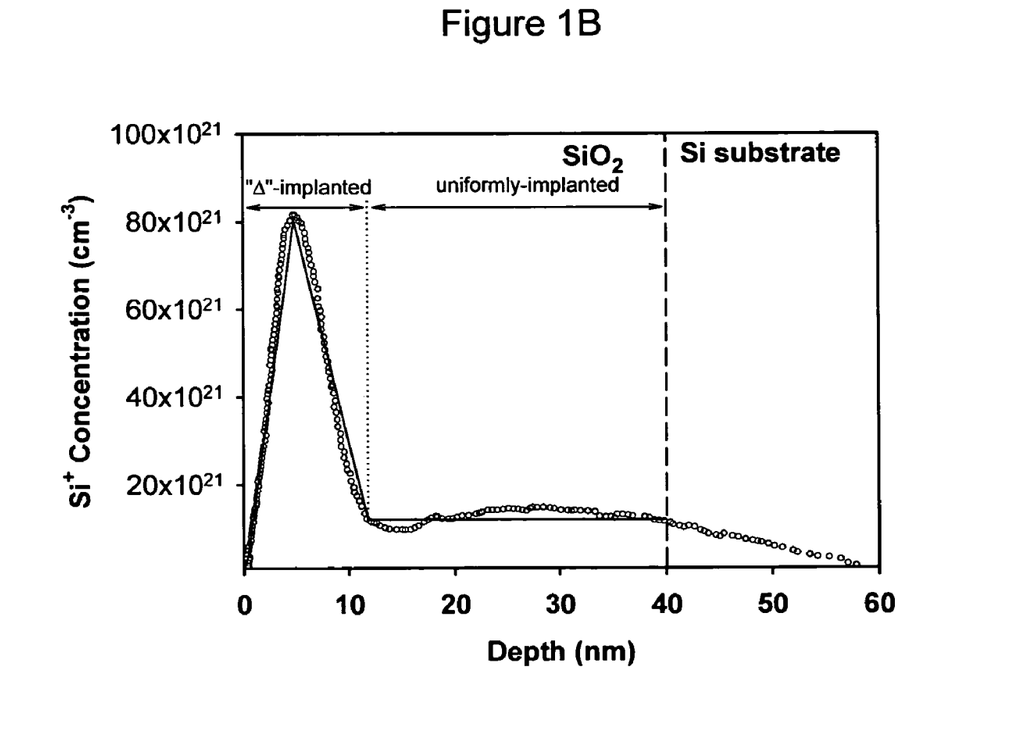

FIG. 1B shows a profile of implanted Si ion concentration versus depth (i.e. distance below the interface of the polysilicon gate and the $SiO_2$ layer or below the $SiO_2$ surface) obtained from Stopping and Range of Ions in Matter (SRIM) simulation according to an embodiment of the present invention. As shown in FIG. 1B, the distribution of the Si ion concentration in the gate oxide can be divided into two regions, i.e. the varying ($\Delta$) implanted region and the uniform implanted region. The varying implanted region typically extends from the interface of the polysilicon gate and the $SiO_2$ layer or from the $SiO_2$ surface to a depth of between about 8 nm to about 16 nm, typically about 12 nm but not so limited. In the varying implanted region, the average Si ion concentration increases with increasing depth below the $SiO_2$ surface, reaching a concentration peak at a depth of between about 3 nm to about 7 nm, typically about 5 nm but not so limited, before the average Si ion concentration decreases with a further increase in depth below the $SiO_2$ surface. The peak value of the Si ion concentration may be positioned at least substantially half depth (thickness) of the varying implanted region below the $SiO_2$ surface or it may be positioned nearer to polysilicon gate or it may even be positioned nearer to the uniform implanted region, depending on requirements.

The uniform implanted region typically extends from an end of the varying implanted region proximate to the Si substrate (i.e. the end is positioned at a depth of between about 8 nm to about 16 nm typically 12 nm but not so limited below the $SiO_2$ surface), to the interface of the $SiO_2$ and Si substrate (i.e. the interface is positioned at a depth of between about 40 nm to about 50 nm but not so limited below the $SiO_2$ surface). The depth (thickness) of the uniform implanted region below the varying implanted region is about 10 nm to about 50 nm, typically about 30 nm but not so limited. In the uniform implanted region, the average Si ion concentration is essentially uniform or uniform. The width of the varying implanted region and the uniform implanted region can be scaled down or up according to actual device dimensions.

The varying implanted region is formed by ion implantation at a low energy and with a high dosage while the uniform implanted region is formed by ion implantation at a higher energy and with a high dosage. The varying implanted region and the uniform implanted region may not be two distinct regions and may overlap at some regions. The Si ion concentration may vary within the same depth below the $SiO_2$ surface, but an average Si ion concentration in the varying implanted region is typically higher than an average Si ion concentration in the uniform implanted region. The peak value of the Si ion concentration in the varying implanted region is thereby also higher than the average Si ion concentration in the uniform implanted region. The peak value of the Si ion concentration in the varying implanted region is approximately $80\times10^{21}$ cm$^{-3}$ as shown in FIG. 1B. The minimum value of the Si ion implantation dosage for the respective regions is approximately $5\times10^{14}$ cm$^{-2}$ and the maximum value of the Si ion implantation dosage is approximately $5\times10^{17}$ cm$^{-2}$.

The varying implanted region is well suited for the purpose of fast program and erase based on gate injection mechanism, while the uniform implanted region can increase the memory window.

In a conventional nc-Si Flash memory with a structure of control oxide/nc-Si layer/tunnel oxide, electrons are injected into the nc-Si from an inversion layer formed in the Si substrate when the transistor is turned on. Thus any delay due to the formation of the inversion layer will limit the programming speed of the Flash memory. In contrast, in the IT-DRAM, electrons are injected directly from the n-type or n+-polysilicon gate into the nc-Si in the varying implanted region under Fowler-Nordheim (FN) injection at a negative gate bias. Therefore, the programming speed can be fast enough for a DRAM application.

To increase the threshold voltage shift due to electron trapping in the nc-Si during programming or to increase the memory window, it is desirable to have electron trapping in the nc-Si located close to the $SiO_2$/Si substrate interface. When electron trapping is closer to the $SiO_2$/Si substrate interface or farther away from the polysilicon gate, the threshold voltage shift is higher and thus the memory window is larger. Therefore, the uniform implanted region is created to increase the memory window. The memory window can be further increased by increasing the nc-Si concentration in the uniform implanted region.

The position of the peak Si ion concentration may affect the respective program or erase speed and the memory window. If the position of the peak Si ion concentration is closer to the polysilicon gate, the respective program or erase speed is higher but the memory window is smaller; otherwise, the respective program or erase speed is lower but the memory window is larger. When the peak Si ion concentration is closer to the polysilicon gate (this means that most of the Si ions are located near the polysilicon gate), it is therefore easier to inject electrons from the polysilicon gate to the Si ions or nc-Si formed therein or remove the trapped electrons from the nc-Si to the polysilicon gate, leading to a faster program or erase speed. However, the memory window or flat-band voltage shift due to electron trapping in the nc-Si is most significant when the electron trapping occurs at the interface of $SiO_2$/Si substrate. Therefore, the flat-band voltage shift is smaller if the peak Si ion concentration is closer to the polysilicon gate (i.e., the electron trapping in most of the nc-Si is farther away from the interface of $SiO_2$/Si substrate).

A fast charging by electron injection from the gate is realized by the formation of tunneling paths to the uncharged nc-Si in the varying implanted region and the uniform implanted region. Therefore, the IT-DRAM structure has a high programming speed and a sufficient memory window. Similarly, an erase operation can be realized by electron tunneling out from the nc-Si to the polysilicon gate under a positive gate bias and a fast erase can also be achieved based on the reasons similar to those for the programming.

The fast programming and erase is inversely correlated with the charge retention time. The charge retention time of a conventional flash device is approximately 10 years. In a conventional flash memory based on nc-Si, the nc-Si layer is isolated by the tunnel oxide and the control oxide, and thus the charges trapped in the nc-Si cannot tunnel out from the nc-Si easily. However, if nanocrystal is distributed throughout the gate oxide, the charges trapped in the nc-Si can easily tunnel to the gate and/or the substrate because the nanocrystals can form many conductive percolation paths connecting to the gate and the substrate. As such the charge retention time is very short. Therefore, with the nc-Si distributed throughout the gate oxide, the charge retention time is typically much shorter than that of a conventional nc-Si-based Flash memory where the nc-Si is confined in a very narrow layer isolated by $SiO_2$. However, as the magnitude of the positive gate voltage under "read" operation is much lower than that required for the erase operation, the charge retention time is long enough for DRAM applications.

N-channel metal-oxide-semiconductors field-effect-transistor (MOSFET)s with the gate oxide containing the nc-Si are typically fabricated with a conventional 2 μm complementary metal-oxide-semiconductor (CMOS) process. To synthesize the nanocrystals in the $SiO_2$, for example a Si-ions implantation method or a chemical vapor deposition (CVD) method or any other suitable processes can be used.

As an example for fabrication using the Si-ions implantation method, an approximately 40 nm thick of $SiO_2$ thin film is thermally grown in dry oxygen at approximately 950° C. on a p-type Si substrate (100). $Si^+$ ions with a dose of about $5 \times 10^{16}$ $cm^{-2}$ are implanted at an implantation energy of about 18 keV to form the uniform implanted region. Then an additional Si ion implantation with a dose of about $5 \times 10^{16}$ $cm^{-2}$ Si is carried out at 2 keV to form the varying implanted region. Thermal annealing is carried out in $N_2$ ambient at approximately 1000° C. for approximately 1 hour.

As an example for fabrication using the CVD method, approximately 1 to 2 nm thick of $SiO_2$ is thermally grown on the p-type Si substrate in dry oxygen. A layer of silicon nanocrystals with a density of approximately $1 \times 10^{12}$ $cm^{-2}$ is deposited by low-pressure-CVD (LPCVD). Subsequently, approximately 1 to 2 nm thick of $SiO_2$ is then deposited by plasma-enhanced-CVD (PECVD). The steps of growing of nc-Si via LPCVD and deposition of $SiO_2$ via PECVD are repeated for two or more times depending on the requirements of the applications. For the last nanocrystal layer (the layer closer to the polysilicon gate), the nanocrystal density shall be higher as this corresponds to the varying implanted region.

The implantation dosage and implantation energy may be different for different device dimensions. The respective implantation dosage and implantation energy in both the two ion implantations can be varied to maximize both the programming and erasing speed and the memory window. The implantation dosage can be controlled in terms of the ion current and implantation time and the implantation energy can be changed by varying the acceleration voltage of the implanter.

In the ion implantation method, both the implantation dosage and implantation energy can be controlled independently. The concentration of the Si ions and the depth profile in the $SiO_2$ are determined by both the implantation dosage and implantation energy. For Si ion implantation into $SiO_2$, the implantation dosage and energy can be obtained from a simulation like Transfer of Ions in Matter (TRIM) or SRIM for a desired ion concentration and depth profile. For the CVD method, the density of the nanocrystals can be controlled by varying the deposition time, substrate temperature and pressure.

After the process of forming the nanocrystals and the gate oxide, the polysilicon gate electrode is deposited by PECVD. The rest of the fabrication process follows the conventional CMOS process. Electrical characterization may be performed on transistors with a width/length (W/L) ratio of 10 μm/3 μm for example. Current-voltage (I-V) measurements may be conducted in the dark at room temperature with a HP 4156 semiconductor parameter analyzer but any other suitable measurement devices may also be used.

Figure 2:
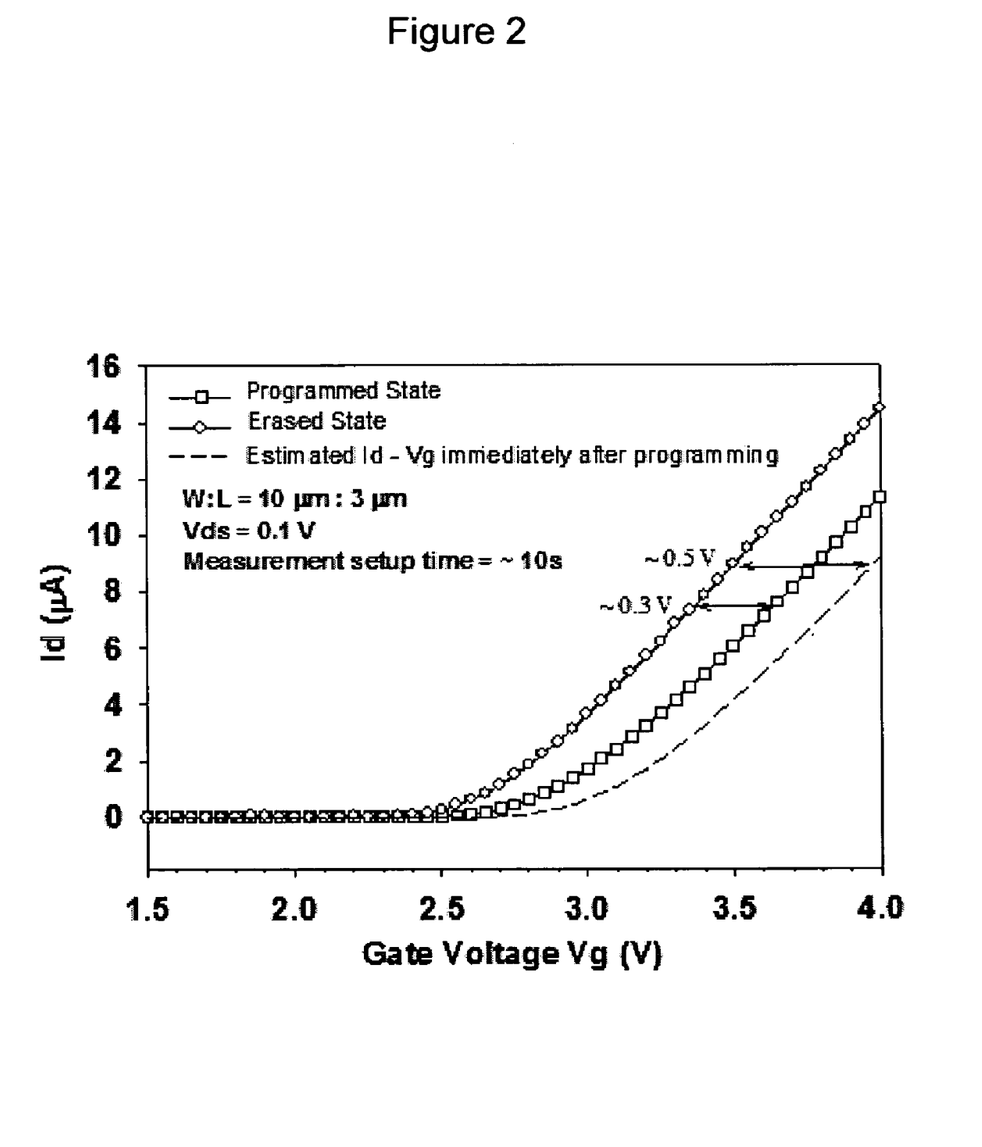
FIG. 2 shows a measured transfer characteristics plot (drain current, Id versus gate voltage, Vg) of a 1-transistor DRAM after program and erase operations according to an embodiment of the present invention.

FIG. 2 shows a measured transfer characteristics plot (drain current, Id versus gate voltage, Vg) of a IT-DRAM after program and erase operations according to an embodiment of the present invention. The program and erase operations are carried out at the respective gate voltages of –12 V and +12 V, with all the other terminals, source, drain and bulk grounded. The programming-voltage polarity is opposite to that of the conventional NAND Flash memory cell which utilizes positive voltage for program and negative voltage for erase. The programming time is approximately 3 ns while the erase time is approximately 30 ns. The difference in threshold voltage between the programmed state and the erased state or the memory window is approximately 0.3 V as determined from FIG. 2. As the measurement setup time is approximately 10 s, the memory window as determined from FIG. 2 is significantly smaller than the initial memory window when the programming has just completed. The estimated initial memory window is approximately 0.5 V as shown in FIG. 2. It is noted from publication "A simple 1-transistor capacitorless memory cell for high performance embedded DRAMs", Pierre C, Fazan et. al., IEEE 2002 Custom Integrated Circuits Conference that a memory window of approximately 0.2 V should be sufficient to determine the two respective memory states of "0" (programmed) and "1" (erased). It should also be noted that both the programming voltage and programming time can be reduced when the memory structure is further optimized and/or the device dimension are scaled down by using an advanced CMOS technology such as the 90 nm technology.

Figure 3:
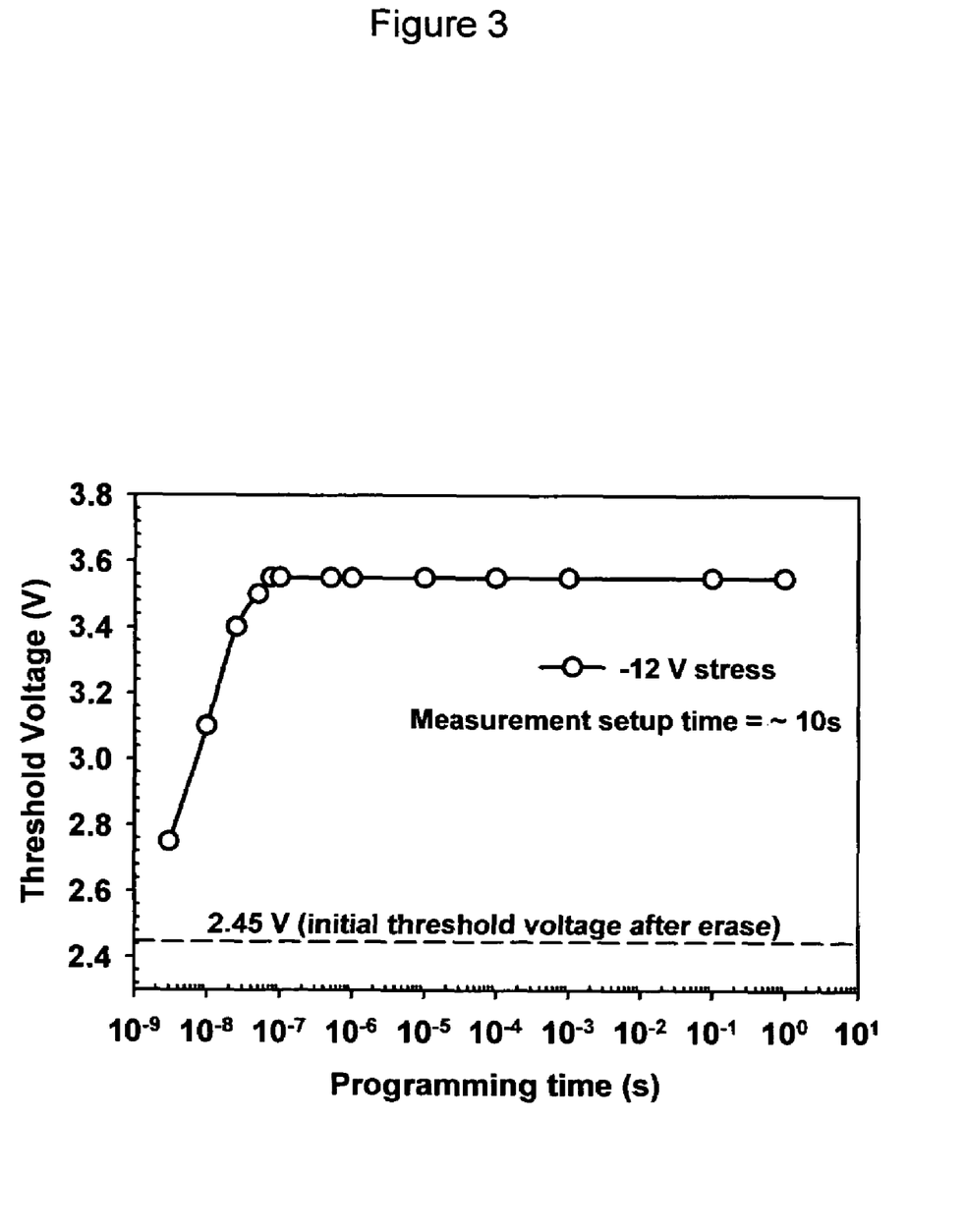
FIG. 3 shows a plot of measured threshold voltage versus programming time of a 1-transistor DRAM with application of a gate voltage of −12V according to an embodiment of the present invention.

FIG. 3 shows a plot of measured threshold voltage versus programming time of a IT-DRAM with application of a gate voltage of –12V according to an embodiment of the present invention. As the measurement setup time is approximately 10 s, the actual initial threshold voltage immediately after programming is approximately 0.2 V larger than the measured threshold voltage shown in FIG. 3. For programming time shorter than approximately 50 ns, the threshold voltage shift increases with programming time. However the threshold voltage shift becomes saturated when the programming time is longer than approximately 50 ns. The measured memory window is approximately 0.3 V (the estimated initial memory window is approximately 0.5 V) for a programming time of approximately 3 ns, the measured memory window increases to approximately 1.0 V for a programming time of approximately 50 ns and is saturated at approximately 1.1 V for a longer programming time. Therefore, the IT-DRAM has a memory window large enough for a DRAM application even when the programming time is shorter than 3 ns.

Figure 4:
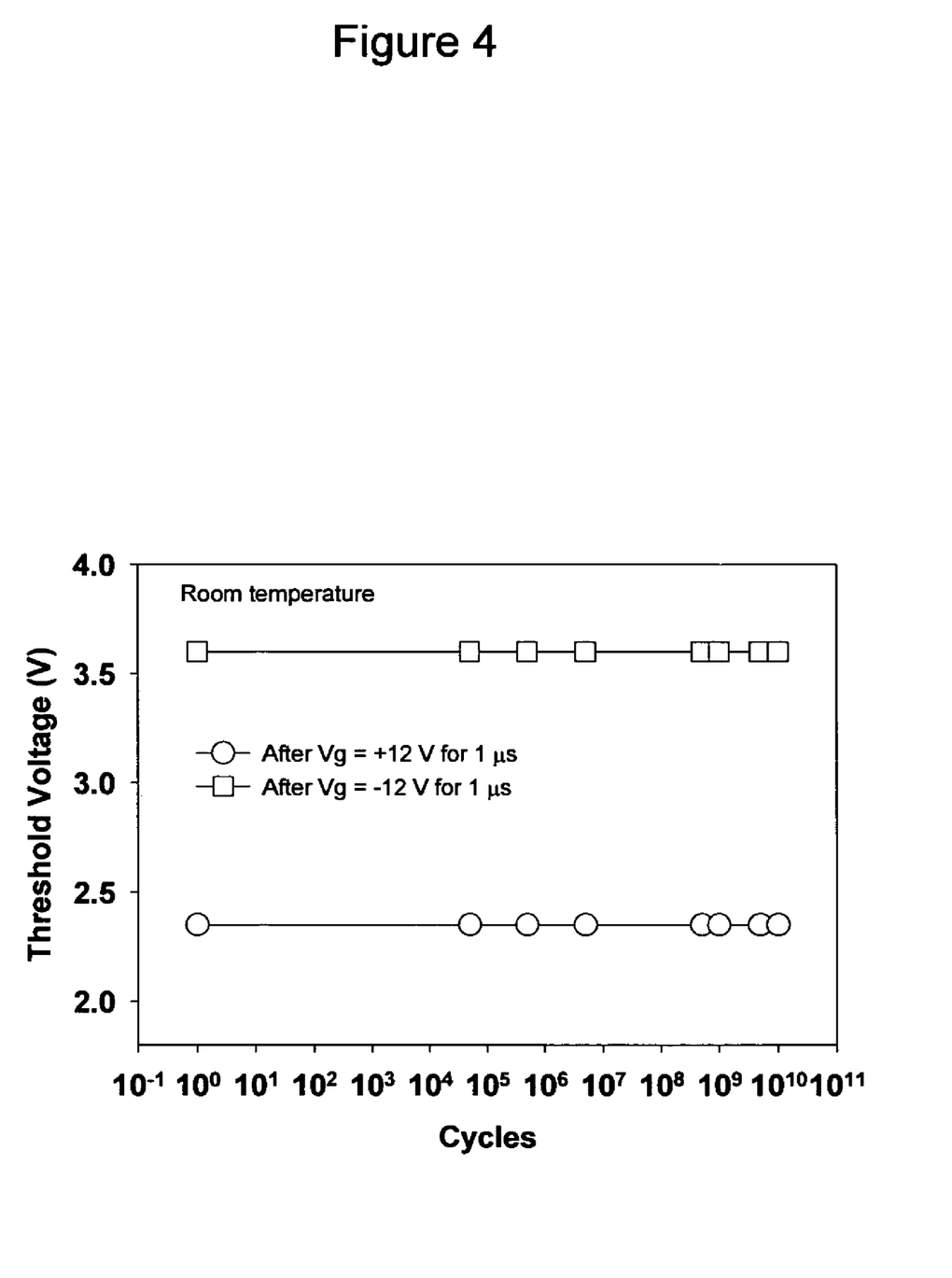
FIG. 4 shows a plot of endurance performance in terms of threshold voltage versus programming cycles of a 1-transistor DRAM according to an embodiment of the present invention.

The endurance characteristics give the memory threshold voltage window, which is the difference between the threshold voltages in the programmed and erased states, as a function of the number of programming cycles. FIG. 4 shows a plot of endurance performance in terms of threshold voltage versus programming cycles of a IT-DRAM according to an embodiment of the present invention. The endurance measurement is conducted with programming/erasing pulses of approximately −12 V/+12 V respectively with a pulse width of approximately 1 μs. Due to the limitation of the measurement facility, the endurance performance can only be measured up to $10^{10}$ programming or erasing cycles. As shown in FIG. 4, there is no sign of a shift in threshold voltage observed within $10^{10}$ programming or erasing cycles. Therefore, it is expected that the actual endurance performance could be much better than within $10^{10}$ programming or erasing cycles.

Figure 5:
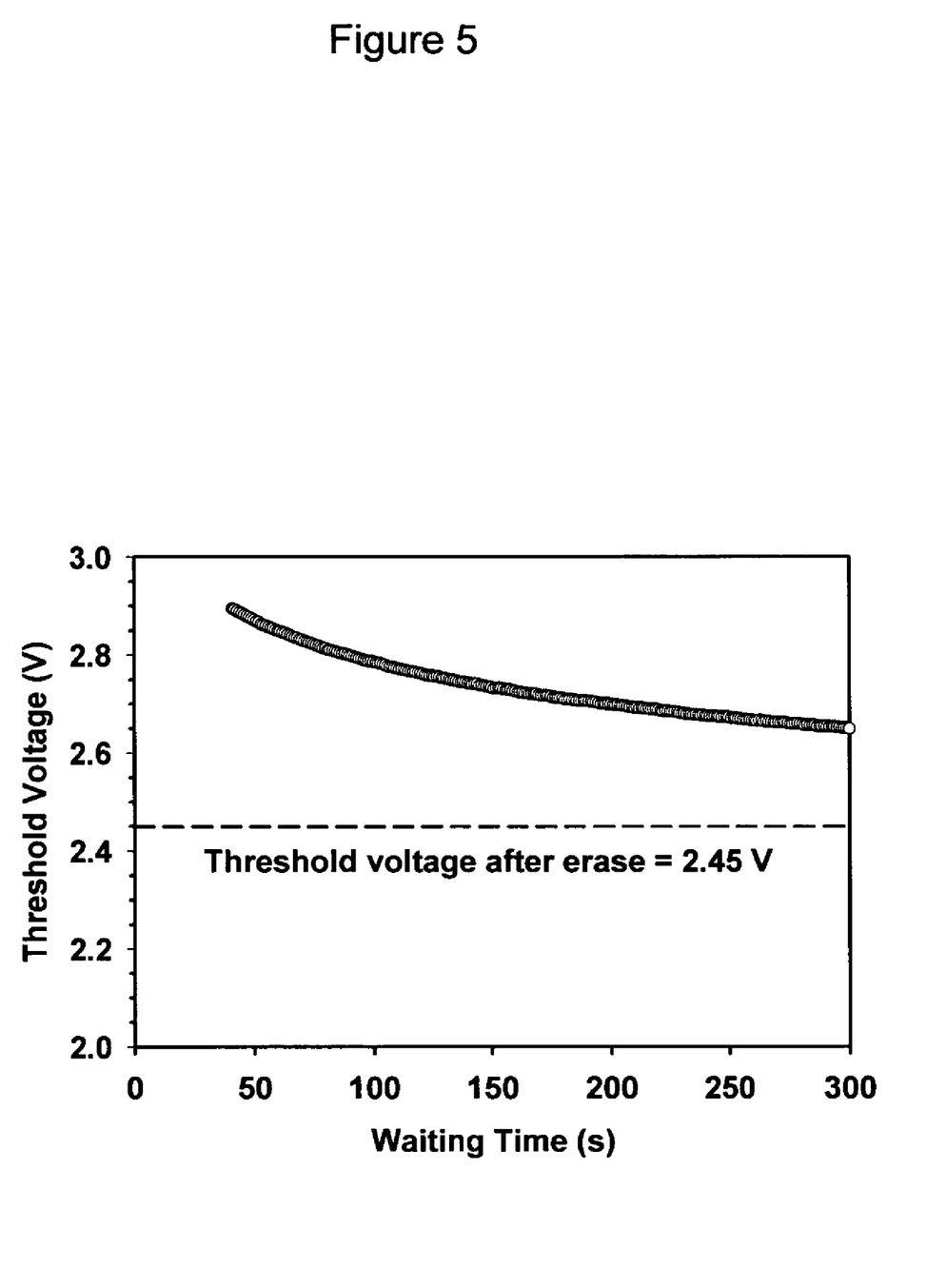
FIG. 5 shows a plot of retention characteristics in terms of threshold voltage versus waiting time of a 1-transistor DRAM at room temperature after programming at −12V for 3 ns according to an embodiment of the present invention.

Retention is a measure of the time that a memory cell can retain the charge whether it is powered or unpowered. FIG. 5 shows a plot of retention characteristics in terms of threshold voltage versus waiting time of a 1-transistor DRAM at room temperature after programming at −12 V for 3 ns according to an embodiment of the present invention. The initial memory window immediately after programming is approximately 0.5 V, and the memory window decreases to approximately 0.2 V after approximately 300 s of waiting time. As a memory window of approximately 0.2 V is sufficient to determine the two memory states of "0" (programmed) and "1" (erased), it is noted that the memory states of the IT-DRAM can be maintained for approximately 300 s. For DRAM applications, the IT-DRAM with a retention time of approximately 300 s is a huge improvement over a conventional 1T1C-DRAM which has a typical retention time of approximately 64 ms. This means that when compared to the conventional 1T1C-DRAM, the IT-DRAM requires much less power dissipation for data refreshment. This is particularly useful for applications in portable electronic devices and when memory density becomes higher.

Standard 1T1C-DRAM array architecture has a single memory cell area between approximately 18 to 26 $F^2$ where F is the technology minimum feature size, and the layout of the DRAM array follows the common open bitline architecture. In contrast, the layout of the IT-DRAM can adapt the NAND Flash array architecture with an effective cell size of approximately 4.5 $F^2$. Therefore, it shall be noted that the IT-DRAM can allow for a higher density of DRAM manufacturing and can have an ultimate sub-nanosecond programming time when the feature size is down to sub-100 nm scale.

The aforementioned description of the various embodiments has been presented for purposes of illustration and description. It is not intended to be exhaustive or to limit the invention to the precise form disclosed, and obviously many modifications and variations are possible in light of the disclosed teaching. It is intended that the scope of the invention be defined by the claims appended hereto.

What is claimed is:

1. A volatile memory structure comprising:
   a semiconductor substrate;
   an insulator layer formed on the semiconductor substrate; and
   a gate layer formed on the insulator layer; the insulator layer comprising:
      a first nanocrystal implanted region proximate to the gate layer; and
      a second nanocrystal implanted region proximate to the semiconductor substrate;
   wherein the first nanocrystal implanted region has an average nanocrystal concentration which is higher than an average nanocrystal concentration of the second nanocrystal implanted region,
   wherein the nanocrystal concentration of the first nanocrystal implanted region varies with depth below the gate layer with one concentration peak and further
   wherein the first nanocrystal implanted region has its nanocrystal concentration peak positioned at least substanstially half depth of said first nanocyrstal implanted region below the gate layer, and
   wherein the depth of the first nanocrystal implanted region below the gate layer is between aboout 8 nm to about 16 nm.

2. The memory structure of claim 1, wherein the nanocrystal concentration of the first nanocrystal implanted region comprises a single concentration peak.

3. The memory structure of claim 1, wherein the nanocrystal concentration of the first nanocrystal implanted region increases with increasing depth below the gate layer.

4. The memory structure of claim 1, wherein the nanocrystal concentration of the first nanocrystal implanted region decreases with increasing depth below the gate layer.

5. The memory structure of claim 1, wherein the nanocrystal concentration of the second nanocrystal implanted region is essentially uniform.

6. The memory structure of claim 1, wherein the peak value of the nanocrystal concentration in the first nanocrystal implanted region is higher than the value of the uniform nanocrystal concentration in the second nanocrystal implanted region.

7. The memory structure of claim 1, wherein the depth of the first nanocrystal implanted region below the gate layer is about 12 nm.

8. The memory structure of claim 1, wherein the nanocrystal concentration peak is at a depth of between about 3 nm to about 7 nm below the gate layer.

9. The memory structure of claim 1, wherein the nanocrystal concentration peak is at a depth of about 5 nm below the gate layer.

10. The memory structure of claim 1, wherein the depth of the second nanocrystal implanted region below the first nanocrystal implanted region is between about 10 nm to about 50 nm.

11. The memory structure of claim 1, wherein the depth of the second nanocrystal implanted region below the first nanocrystal implanted region is about 30 nm.

12. The memory structure of claim 1, wherein the nanocrystal comprises a mean diameter of between about 1 nm to about 10 nm.

13. The memory structure of claim 1, wherein the nanocrystal comprises a semiconductor material, a metal or a metal alloy.

14. The memory structure of claim 13, wherein the nanocrystal comprise a metal selected from a group of metals consisting of aluminum, gold, silver, cobalt, tin, iron, copper, nickel, palladium, platinum, rhodium, tungsten and combinations thereof.

15. The memory structure of claim 13, wherein the metal alloy comprise a combination of two or more metals selected from the group consisting of aluminum, gold, silver, cobalt, tin, iron, copper, nickel, palladium, platinum, rhodium and tungsten.

16. The memory structure of claim 13, wherein the nanocrystal comprises a semiconductor material selected from the group consisting of silicon, germanium, silicon germanium, silicon carbide, gallium arsenide, indium arsenide.

17. The memory structure of claim 1, wherein the semiconductor substrate is selected from the group consisting of silicon, germanium, silicon germanium, silicon on insulator.

18. The memory structure of claim 1, wherein the insulator layer is a dielectric material.

19. The memory structure of claim 1, wherein the insulator layer comprises a material selected from the group consisting of silicon oxide, silicon nitride, silicon oxynitride, a high-k dielectric material.

20. The memory structure of claim 19, wherein the high-k dielectric material is selected from the group consisting of hafnium oxide, hafnium aluminate, yttrium oxide.

21. The memory structure of claim 1, further comprising a source region in the semiconductor substrate located on one side of the insulator layer and a drain region in the semiconductor substrate located on the other side of the insulator layer.

* * * * *